United States Patent [19]

Yoshihiro

[11] Patent Number: 4,663,555
[45] Date of Patent: May 5, 1987

[54] METHOD AND APPARATUS FOR CONTROLLING A BIMORPH LEAF WHICH SUPPORTS A DEFLECTABLE HEAD

[75] Inventor: Mitsugu Yoshihiro, Kanagawa, Japan

[73] Assignee: Sony Corporation, Tokyo, Japan

[21] Appl. No.: 836,159

[22] Filed: Mar. 4, 1986

[30] Foreign Application Priority Data

Mar. 12, 1985 [JP] Japan .................................. 60-48688

[51] Int. Cl.$^4$ ........................ H01L 41/08; G11B 5/52
[52] U.S. Cl. ................................. 310/317; 310/316; 310/319; 310/326; 310/332; 360/77
[58] Field of Search .............. 310/316, 317, 319, 332, 310/326, 329; 360/75–78, 107, 109

[56] References Cited

U.S. PATENT DOCUMENTS

| | | | |
|---|---|---|---|
| 4,093,885 | 6/1978 | Brown | 310/316 X |
| 4,099,211 | 7/1978 | Hathaway | 360/109 |
| 4,259,605 | 3/1981 | Rijckaert | 310/317 |
| 4,395,741 | 7/1983 | Kobayashi et al. | 360/77 |
| 4,513,334 | 4/1985 | Otsuka | 310/317 X |
| 4,594,526 | 6/1986 | Araki et al. | 310/317 |

Primary Examiner—Mark O. Budd
Attorney, Agent, or Firm—Lewis H. Eslinger; Alvin Sinderbrand

[57] ABSTRACT

An apparatus for controlling a deflectable head mounted on a bimorph leaf having a detector connected to the latter for detecting a deflection of the bimorph leaf, a drive signal generating circuit for generating a drive signal to deflect the bimorph leaf in response thereto, a combining circuit for combining output signals of the detector and the drive signal generating circuit, a damping signal generating circuit for generating a damping signal to attenuate a distortion of the bimorph leaf that is produced by the deflection of the bimorph leaf, a signal producing circuit for generating a signal corresponding to a variation of the detector that remains after application of the damping signal to the bimorph leaf, and a circuit connected between the signal producing circuit and the combining circuit for compensating and thereby reducing the signal corresponding to the remaining variation of the detector.

14 Claims, 3 Drawing Figures

METHOD AND APPARATUS FOR CONTROLLING A BIMORPH LEAF WHICH SUPPORTS A DEFLECTABLE HEAD

BACKGROUND OF THE INVENTION

1. Field of the Invention

The present invention relates to an apparatus for controlling a deflectable head for use with a VTR (video tape recorder), and more particularly is directed to an apparatus and method for reducing a secular or slowly occurring variation of a bimorph distortion detection device attached to a bimorph leaf mounting a deflectable head of a VTR.

2. Description of the Prior Art

A VTR is known in which a magnetic head chip is attached to one end of a bimorph leaf which has its other end fixed to a rotary drum body and a drive signal is supplied to the bimorph leaf so that even in a variable speed playback mode, the rotary magnetic head chip can be made to positively scan a skewed or slant track formed on a magnetic tape. For instance, a bimorph head tracking system using the so-called wobbling technique is disclosed in U.S. Pat. No. 4,229,773. Also, a technique using a strain gauge to detect the deflection of a bimorph leaf is disclosed in U.S. Pat. No. 4,172,265 and a technique using a damping A.C. signal to correct the hysteresis of a bimorph leaf is disclosed in U.S. Pat. No. 4,513,334.

In a bimorph driving apparatus for such bimorph deflectable head, the bimorph leaf contains in its electro-mechanical transducer characteristic a hysteresis characteristic and, the secular or slowing occurring variation of its sensitivity and the variation of its sensitivity in response to temperature changes are large. Therefore, in a correcting circuit of the prior art, strain gauges are attached to both sides of the bimorph leaf and a distortion or deflection detecting output derived from the strain gauges is negatively fed back to the driving signal.

However, such prior art correcting circuit for a bimorph deflectable head has the following defects. The offset amount of the distortion or deflection detecting output from the strain gauges attached to the bimorph leaf has a secular variation so that there is an error occurs in the indication of the distortion, displacement or deflection amount of the bimorph deflectable head. In other words, after a damping A.C. signal is applied to the bimorph leaf, the deflection or distortion of the bimorph leaf becomes zero. Accordingly, the signal output from the strain gauge (e.g., in practice, signal generated by the change of the resistance value of the strain gauge) should become a constant value corresponding to the zero distortion or deflection of the bimorph leaf. However, if in the strain gauge itself there is a scattering or a secular variation occurs, the signal output from the strain gauge can take various values relative to the zero distortion or deflection of the bimorph leaf and frequently does not become the constant value. As a result, the distortion or deflection of the bimorph deflectable head can not be controlled correctly.

OBJECTS AND SUMMARY OF THE INVENTION

Accordingly, it is a general object of the present invention to provide an improved method and apparatus for controlling a deflectable head.

More particularly, it is an object of the present invention to provide an apparatus for controlling a bimorph deflectable head so that the latter can positively scan a slant track formed on a magnetic tape.

Another object of the present invention is to provide an apparatus for controlling a deflectable head which can remove an error in the deflection amount generated in the direction substantially perpendicular to the head scanning direction due to a secular variation of the offset amount of the distortion detecting output from a strain gauge.

A further object of the invention is to provide a method and an apparatus for reducing a secular variation of a bimorph distortion detecting device attached to a bimorph leaf to which a head is attached for use with a VTR.

According to one aspect of the present invention, there is provided an apparatus for reducing a secular variation of a bimorph distortion detecting device attached on a bimorph leaf, comprising:

means connected to said bimorph leaf for generating a damping signal used to reduce a distortion of said bimorph leaf;

signal producing means for generating a signal corresponding to any secular variation of said bimorph distortion detecting device remaining after said distortion of said bimorph leaf is reduced;

means for shifting a DC voltage level of an output signal of said signal producing means to a predetermined DC voltage level; and means for supplying said DC signal having said predetermined DC voltage level to said bimorph leaf.

According to another aspect of the present invention, there is provided an apparatus for controlling a deflectable head which is mounted on a bimorph leaf, comprising:

detector means connected with said bimorph leaf for detecting a deflection of said bimorph leaf;

means for generating a drive signal to deflect said bimorph leaf in response thereto;

means for combining output signals of said detector means and said drive signal generating means;

means for generating a damping signal to attenuate a distortion of said bimorph leaf that is produced by said deflection of said bimorph leaf;

signal producing means for for generating a signal corresponding to a variation of said detector means remaining after application of said dampling signal to said bimorph leaf; and means connected between said signal producing means and said combining means for compensating and thereby reducing said signal corresponding to said remaining variation of said detector means.

According to a further aspect of the present invention, there is provided a method for reducing a secular variation of a bimorph distortion detecting circuit attached to a bimorph leaf, comprising the steps of:

supplying a damping signal to said bimorph leaf so that a distortion of said bimorph leaf is reduced;

detecting a DC voltage level derived from said bimorph distortion detecting circuit when said distortion of said bimorph leaf is reduced;

shifting the DC voltage level derived from the distortion detecting circuit to a predetermined DC voltage level; and supplying the predetermined DC voltage level to said bimorph leaf.

The above, and other objects, features and advantages of the present invention, will become apparent from the following detailed description of the preferred embodiment taken in conjunction with the accompanying drawings.

DESCRIPTION OF THE PREFERRED EMBODIMENT

An apparatus for controlling a deflectable head according to an embodiment of the present invention will hereinafter be described with reference to FIGS. 1 to 3.

Figure 1:
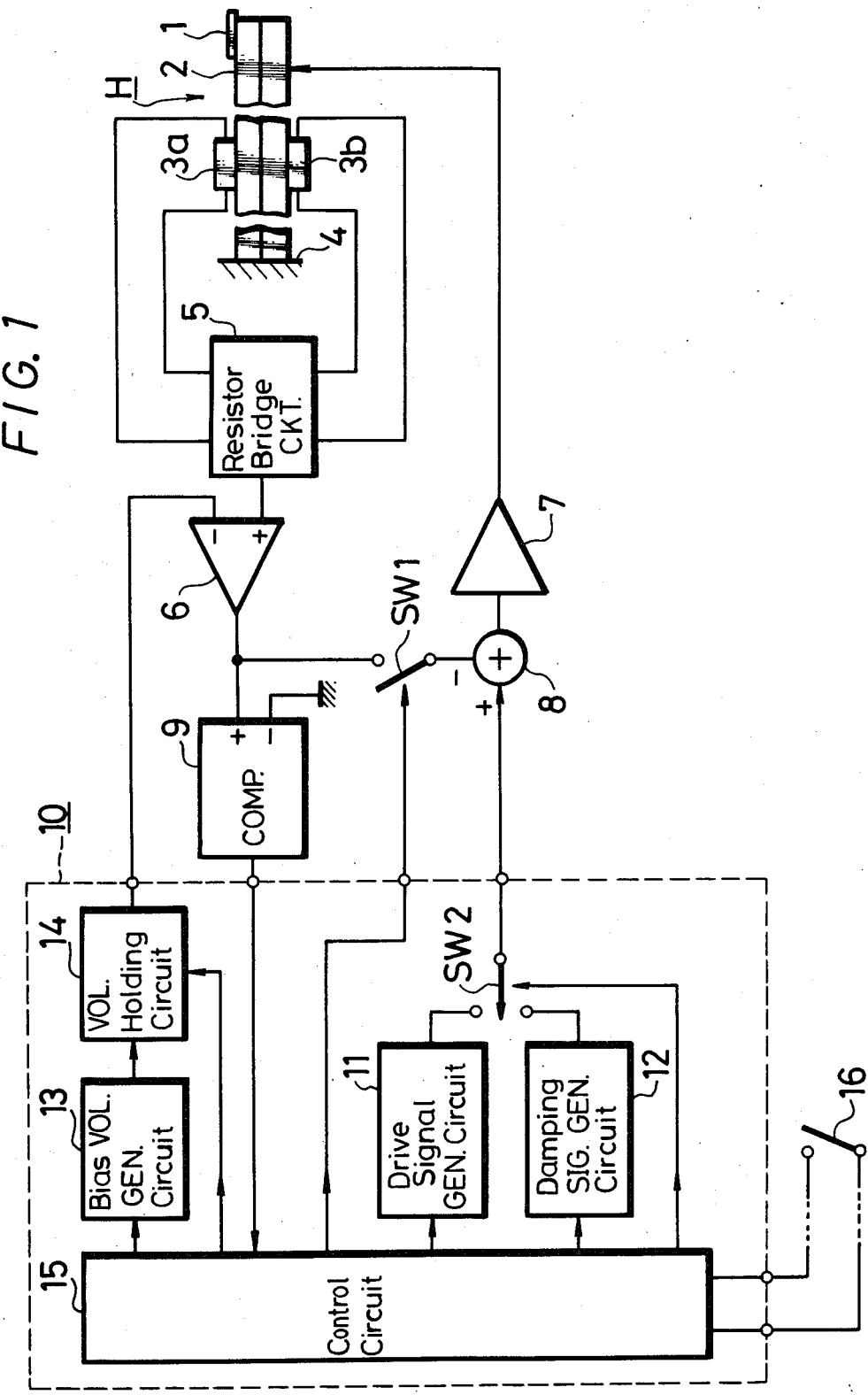
FIG. 1 is a block diagram showing an apparatus for controlling a deflectable head according to an embodiment of the present invention.

In FIG. 1, reference numeral 1 generally designates a head chip of one or a plurality of rotary magnetic heads mounted on a tape guide drum of a VTR. This head chip or head 1 is attached to one end of a bimorph leaf 2. The other end of the bimorph leaf 2 is secured to a part of a rotary drum 4 and the head 1 can be deflected or displaced by the bimorph leaf 2 in the direction substantially perpendicular or transverse to its tracing or scanning direction. On both the surfaces of the flexible bimorph leaf 2, there are bonded strain gauges 3a and 3b, respectively. Thus, the bimorph deflectable head assembly H is constructed.

A resistor bridge circuit 5 includes the above mentioned strain gauges 3a and 3b as two of its sides and generates a difference output between the outputs of the strain gauges 3a and 3b, that is, a distortion detecting output. The resistor bridge circuit 5 will be described more fully with reference to FIG. 2.

Figure 2:
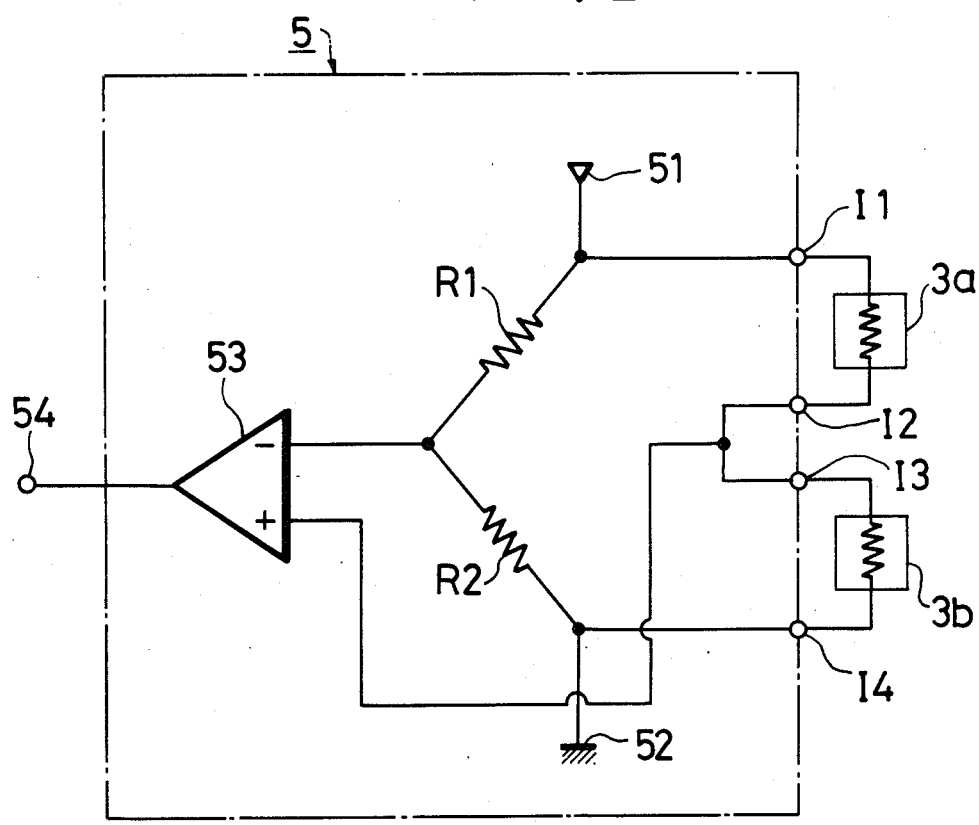
FIG. 2 is a circuit diagram showing one example of a practical circuit arrangement of a resistor bridge circuit used in the apparatus of FIG. 1.
Figure 3:
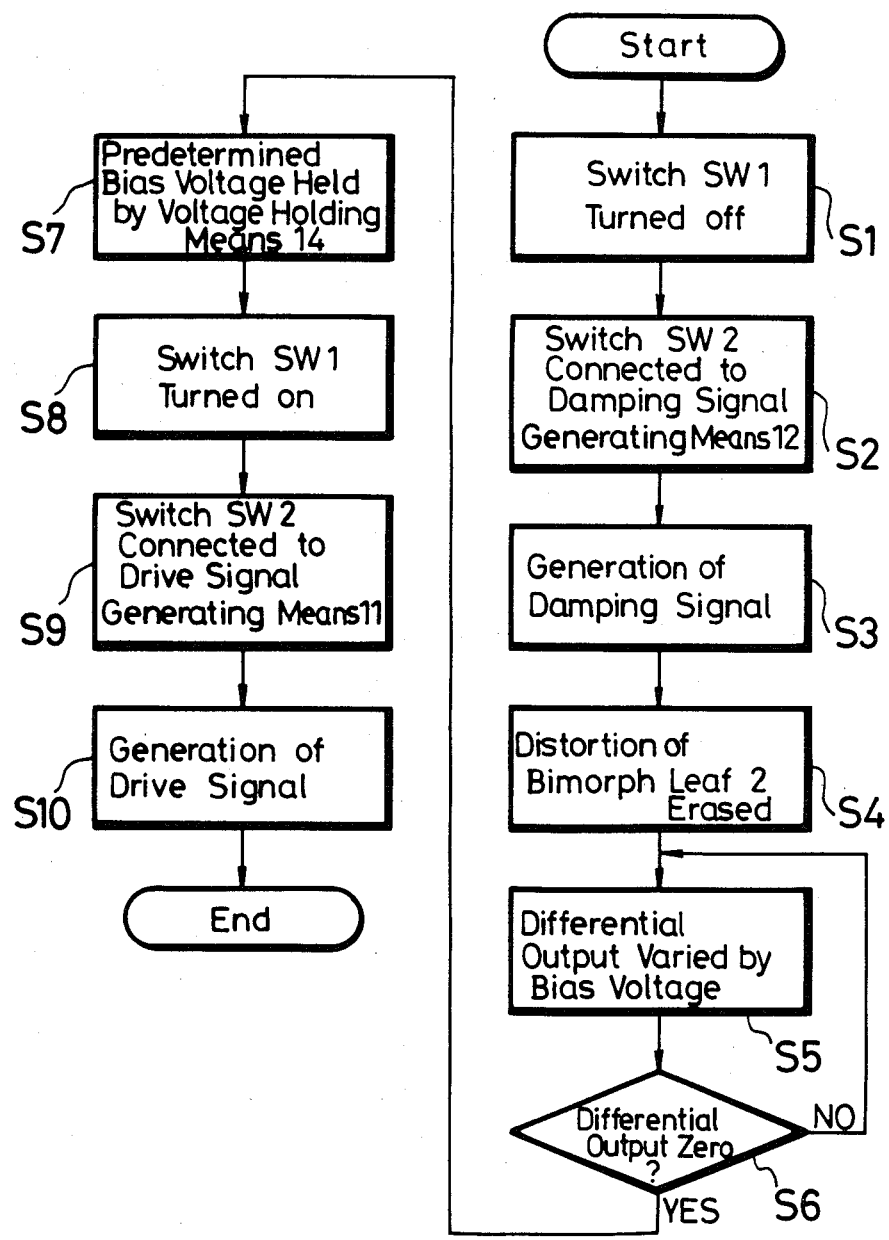
FIG. 3 is a flow chart to which reference is made in explaining the operation of the apparatus shown in FIG. 1.

As FIG. 2 shows, the resistor bridge circuit 5 comprises two resistors R1 and R2 connected in series between a power source terminal 51 and a ground 52 with the connection point or junction between the resistors R1 and R2 being connected to one input terminal, specifically, an inverting input terminal, of a differential amplifier 53. The resistor bridge circuit 5 further includes input terminals I1, I2 and I3, I4 which are connected to both ends of the strain gauges 3a and 3b, respectively. The input terminals I1 and I4 are connected to power source terminal 51 and to ground 52, respectively. The input terminals I2 and I3 are connected together and further connected to the other or non-inverting input terminal of the differential amplifier 53. Accordingly, at an output terminal 54 of the resistor bridge circuit 5 lead out from the differential amplifier 53, there appears a voltage which is the difference between the voltage corresponding to the ratio of the resistance values of the resistors R1 and R2 and the voltage corresponding to the ratio of the resistance values of the strain gauges 3a and 3b, namely, a distortion detection output.

Turning back to FIG. 1, it will be seen that a differential amplifier 6 is supplied at one input terminal with the distortion detection output from the resistor bridge circuit 5 and is supplied at another input terminal with an output from a bias voltage generating circuit 13 via a voltage holding circuit 14.

The output from the differential amplifier 6 is supplied, when the distortion of the bimorph leaf 2 is erased, to a comparator circuit 9 in which it is compared with a zero voltage or ground potential. A drive amplifier 7 is adapted to supply the drive signal to the bimorph leaf 2 and a mixer or composer 8 is provided at the input side of the drive amplifier 7. When the bimorph leaf 2 is driven in the normal mode, the composer 8 is supplied with a drive signal (sawtooth wave signal) from a drive signal generating circuit 11 which will be described later and composer 8 is also supplied with the output from the differential amplifier 6 through a switch SW1. Thus, in the composer 8, the output from differential amplifier 6 is subtracted from the drive signal from the drive signal generating circuit 11. Then, the subtracted output from the composer 8 is supplied to the bimorph leaf 2 via the drive amplifier 2.

Reference numeral 10 generally designates a microprocessor whose function will be described below. The micro-processor 10 comprises the drive signal generating circuit 11, a damping signal generating circuit 12, the bias voltage generating circuit 13 and the voltage holding circuit 14, a control circuit 15 and a change-over switch SW2. The voltage holding circuit 14 is adapted to hold a bias voltage supplied thereto from the bias voltage generating circuit 13. The bias voltage generating circuit 13 and the voltage holding means 14 are controlled by the control circuit 15. The output from the above mentioned comparator circuit 9 is supplied to the control circuit 15. The drive signal from the drive signal generating circuit 11 and the damping signal from the damping signal generating circuit 12 are switched by the change-over switch SW2 and then fed to the above mentioned composer 8. Also, the signal generating circuit 11 and 12 and the change-over switches SW1 and SW2 are all controlled by the control circuit 15.

A switch 16 is adapted to be temporarily turned on, for example, when a tape cassette is loaded into the cassette compartment of the VTR. From the switch 16, a detection signal indicative of the loading of the tape cassette into the VTR is supplied to the control means 15 in the micro-processor 10. The switch 16 may be a manual switch or a timer switch which is capable of being turned on once every day or once every two days. Although the secular or slowly accumulated variation of the distortion of the strain gauge is as small as 1 $\mu$m each day, if such secular variation is accumulated over several days, weeks or months, such accumulated secular variation can not be neglected.

The operation of this apparatus shown in FIG. 1 will be described next with reference to a flow chart of FIG. 3. When the tape cassette is loaded into the VTR, the switch 16 is temporarily turned on so that the loading of the tape cassette into the VTR is detected by the control circuit 15 in the micro-processor 10. Then, the control circuit 15 turns off or opens the change-over switch SW1 (at step S1) and the movable contact of the change-over switch SW2 is engaged with the fixed contact connected to the damping signal generating circuit 12 (at step S2). As a result, the damping signal is generated by the damping signal generating circuit 12

(at step S3) in response to the control circuit 15 and then fed to the bimorph leaf 2 via the change-over switch SW2, the composer 8 and the drive amplifier 7 during a pedetermined period and thereby the distortion of the bimorph leaf 2 is erased (at step S4). After the erasure of the distortion of the bimorph leaf 2 has been completed, the distortion detection output detected by the resistor bridge circuit 5 is supplied to one input terminal of the differential amplifier 6. The output from the differential amplifier 6 is supplied to the comparing circuit 9 in which it is compared with the zero voltage. The compared output from the comparing circuit 9 is supplied to the control circuit 15. On the basis of such compared output supplied thereto, the control circuit 15 controls the bias voltage generating circuit 13 (at step S5) so that the latter supplies to the other input terminal of the differential amplifier 6 a bias voltage which makes the output voltage from the differential amplifier 6 become zero voltage. When the output voltage from the differential amplifier 6 becomes zero (at step S6), the predetermined bias voltage at that time is held by the voltage holding circuit 14 (at step S7) and then the voltage held is fed to the other input terminal of the differential amplifier 6. However, when the output from the differential amplifier 6 is not zero, the routine is returned to step S5 and the bias voltage generating circuit 13 is controlled by the control circuit 15 to suitably vary the bias voltage. Then, the above operation is carried out until the output from the differential amplifier 6 becomes zero. Thereafter, the control circuit 15 causes switch SW1 to close or turn on (at step S8) and switch SW2 to change-over to the position in which its movable contact engages the fixed contact connected to the drive signal generating circuit 11 (at step S9) so that the drive signal generating circuit 11 is controlled by the control circuit 15 so as to generate a drive signal having an initial deflection amount, frequency and rate of change corresponding to the running speed of the magnetic tape (at step S10). This drive signal is supplied via the change-over switch SW2 to the composer 8 in which the output from the differential amplifier 6 is subtracted from the same. The subtracted output from the composer 8 is supplied via the drive amplifier 7 to the bimorph leaf 2 so that the bimorph leaf 2 is driven to enable the head 1 to positively and accurately scan the slant track formed on the magnetic tape.

According to the present invention as set forth above, it is possible to remove the reduction of the response speed of the bimorph leaf caused by the hysteresis effects of its electro-mechanical transducer characteristic, the secular variation of its sensitivity, the variation of its sensitivity due to changes in temperature and so on.

Further, according to the present invention, it is possible to remove the error in the amount of the displacement or deflection in the direction substantially perpendicular to the head scanning direction caused by the secular variation of the offset amount of the distortion detection output from the strain gauge.

Although a single preferred embodiment of the invention has been described above with reference to the drawings, it will be apparent that the invention is not limited to that precise embodiment, and that many modifications and variations could be effected therein by one skilled in the art without departing from the spirit or scope of the invention as defined by the appended claims.

I claim:

1. An apparatus for reducing a secular variation of a bimorph distortion detecting device attached on a bimorph leaf, comprising:
   means connected to said bimorph leaf for generating a damping signal used to reduce a distortion of said bimorph leaf; signal producing means for generating a signal corresponding to said secular variation of said bimorph distortion detecting device that remains after said distortion of said bimorph leaf is reduced; means for shifting a DC voltage level of an output signal of said signal producing means to a predetermined DC voltage level; and means for supplying said DC signal having said predetermined DC voltage level to said bimorph leaf.

2. The apparatus according to claim 1, in which said bimorph distortion detecting device includes a pair of strain gauges affixed to opposite surfaces of said bimorph leaf.

3. The apparatus according to claim 2, in which said signal producing means includes a resistor bridge circuit.

4. The apparatus according to claim 3, in which said means for shifting said DC voltage level includes a bias voltage signal generating circuit for generating a bias voltage signal and a differential amplifier supplied with said bias voltage signal and an output signal of said resistor bridge circuit, and in which a DC voltage level of an output signal of said differential amplifier becomes said predetermined DC voltage level.

5. The apparatus according to claim 4, in which said bias voltage signal generating circuit includes a comparator for comparing said DC voltage level of said output signal of said differential amplifier with said predetermined DC voltage level, a bias voltage signal generator for generating a bias voltage signal in response to an output signal of said comparator and a hold circuit for holding an output signal from said bias voltage signal generator.

6. The apparatus according to claim 5, in which said predetermined DC level is a zero voltage level.

7. The apparatus according to claim 6, in which said resistor bridge circuit includes serial-connected resistors connected between voltage source terminals, means connecting said pair of strain gauges in series between said voltage source terminals, and a differential circuit a first input terminal connected to a junction of said serial-connected strain gauges and a second input terminal connected to a junction of said serial-connected resistors.

8. A method for reducing a secular variation of a bimorph distortion detecting circuit attached on a bimorph leaf, comprising the steps of:
   supplying a damping signal to said bimorph leaf so that a distortion of said bimorph leaf is reduced; detecting a DC voltage level derived from said bimorph distortion detecting circuit after said distortion of said bimorph leaf is reduced; shifting the detected DC voltage level to a predetermined DC voltage level; and supplying the predetermined DC voltage level to said bimorph leaf for removing the reduced distortion of the bimorph leaf.

9. An apparatus for controlling a deflectable head which is mounted on a bimorph leaf, comprising:
   detector means connected with said bimorph leaf for detecting a deflection of said bimorph leaf; means for generating a drive signal to deflect said bimorph leaf in response thereto; means for combining output signals of said detector means and said drive signal generating means; means for generating a damping signal to attenuate a distortion of said bimorph leaf that is produced by said deflection of said bimorph leaf; signal producing means for generating a signal corresponding to a variation of said detector means that remains after application of said damping signal to said bimorph leaf; and means connected between said signal producing means and said combining means for compensating said signal corresponding to said remaining variation to thereby reduce said variation of said detector means.

10. The apparatus according to claim 9, in which said detector means includes a pair of strain gauges affixed to opposite surfaces of the bimorph leaf.

11. The apparatus according to claim 10, in which said signal producing means includes a resistor bridge circuit.

12. The apparatus according to claim 11, in which said means for compensating the signal corresponding to the remaining variation includes a DC level shifting circuit for shifting a DC voltage level of an output signal of said signal producing means to a predetermined DC voltage level.

13. The apparatus according to claim 12, in which said DC level shifting circuit includes a bias voltage signal generating circuit for generating a bias voltage signal, a differential amplifier supplied with said bias voltage signal and an output signal of said resistor bridge circuit so that a DC voltage level of an output signal of said differential amplifier becomes a predetermined DC voltage level.

14. The apparatus according to claim 13, in which said bias voltage signal generating circuit includes a comparator for comparing said DC voltage level of said output signal of said differential amplifier with said predetermined DC voltage level, a bias voltage signal generator for generating said bias voltage signal in response to an output signal of said comparator and a hold circuit for holding an output signal of said bias voltage signal generator.

* * * * *